(12) United States Patent
Pham et al.

(10) Patent No.: US 8,900,800 B2
(45) Date of Patent: Dec. 2, 2014

(54) METHOD FOR PRODUCING A GANLED DEVICE

(71) Applicant: IMEC, Leuven (BE)

(72) Inventors: Nga Phuong Pham, Leuven (BE); John Slabbekoorn, Zichem (BE); Deniz Sabuncuoglu Tezcan, Neerwinden (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/677,891

(22) Filed: Nov. 15, 2012

(65) Prior Publication Data

US 2013/0130180 A1 May 23, 2013

Related U.S. Application Data

(60) Provisional application No. 61/563,266, filed on Nov. 23, 2011.

(51) Int. Cl.
  *G03F 7/30* (2006.01)
  *H01L 33/22* (2010.01)
  *G03F 7/32* (2006.01)

(52) U.S. Cl.
  CPC ....... *G03F 7/30* (2013.01); *H01L 33/22* (2013.01); *G03F 7/322* (2013.01)
  USPC .......................................................... 430/319

(58) Field of Classification Search
  USPC .......................................... 430/311, 313, 319
  See application file for complete search history.

(56) References Cited

U.S. PATENT DOCUMENTS

| | | |
|---|---|---|
| 6,342,426 B1 | 1/2002 | Li et al. |
| 2001/0012593 A1 | 8/2001 | Chang et al. |
| 2007/0190676 A1 | 8/2007 | Chu et al. |
| 2008/0180209 A1* | 7/2008 | Ku et al. .................. 338/34 |
| 2010/0163902 A1 | 7/2010 | Moon |
| 2011/0095306 A1 | 4/2011 | Hwang et al. |
| 2011/0156000 A1 | 6/2011 | Cheng |
| 2012/0018853 A1* | 1/2012 | Tamboli et al. .............. 257/622 |
| 2012/0115308 A1* | 5/2012 | Hua et al. ................... 438/463 |
| 2013/0082290 A1* | 4/2013 | Yan et al. .................. 257/98 |

OTHER PUBLICATIONS

Ma, Lei et al., "Comparison of Different GaN Etching Techniques", CS Mantech Conference, Apr. 24-27, 2006, Vancouver, British Columbia, Canada, pp. 105-108.

* cited by examiner

*Primary Examiner* — Brittany Raymond
(74) *Attorney, Agent, or Firm* — McDonnell Boehnen Hulbert & Berghoff LLP

(57) ABSTRACT

A method for producing a GaNLED device, wherein a stack of layers comprising at least a GaN layer is texturized, is disclosed. The method involves (i) providing a substrate comprising on its surface said stack of layers, (ii) depositing a resist layer directly on said stack, (iii) positioning a mask above said resist layer, said mask covering one or more first portions of said resist layer and not covering one or more second portions of said resist layer, (iv) exposing said second portions of said resist layer to a light source, (v) removing the mask, and (vi) bringing the resist layer in contact with a developer comprising potassium, wherein said developer removes said resist portions that have been exposed and texturizes the surface of at least the top layer of said stack by wet etching said surface, in the areas situated underneath said resist portions that have been exposed.

7 Claims, 4 Drawing Sheets

METHOD FOR PRODUCING A GANLED DEVICE

CROSS-REFERENCE TO RELATED APPLICATIONS

This application claims priority under 35 U.S.C.§119(e) to U.S. Provisional Patent Application Ser. No. 61/563,266, filed on Nov. 23, 2011, and entitled "Method for Producing a GaNLED Device", the full disclosure of which is incorporated herein by reference.

FIELD OF THE DISCLOSURE

The present disclosure is related to the field of semiconductor processing, in particular to the field of GaNLEDs (Gallium Nitride LEDs).

STATE OF THE ART

GaNLED technology has become important in the development and production of various applications, such as notebook and TV backlighting and general lighting. It is known that surface texturization of the GaN layer improves the light extraction efficiency of the LED (extract more light from the device surface). Texturizing of GaN and buffer layer can be done with a suitable wet etching solution such as KOH or by dry etching of the GaN layer. In most cases, texturization by wet etching will roughen the whole surface of the wafer. If further processing on the wafer is needed, the rough surface may hinder other processes, such as lithography steps, performed after the roughening. A rough surface can cause problems for the alignment of a litho tool as the tool cannot clearly see the alignment mark.

Selective texturization of a LED layer is known in the art, e.g. from U.S. Patent Application Pub. No. 2011/0095306, where a nitride layer pattern or a patterned photoresist layer is used to block certain areas of the layer from being texturized. Texturization is a separate step, i.e. it is required to form the patterned layer, for example develop exposed resist portions, and subsequently move the substrate to a suitable etching tool for the texturizing. KOH is not usable for texturizing when a patterned photoresist layer is used, as KOH etches the photoresist. Selective texturization as presently known in the art is therefore technically complex and time-consuming.

OVERVIEW OF THE DISCLOSURE

The disclosure focuses on selectively texturizing a GaN-LED layer using patterning of the resist layer. By using photoresist patterning, only the area exposed to solution is texturized while the area covered with resist will be protected and not texturized.

The disclosure is related to a method for producing a GaN-LED device, wherein a stack of layers comprising at least a GaN layer is texturized. According to an example, the method includes the following steps:
providing a substrate comprising on its surface said stack of layers;
depositing a resist layer directly on said stack;
positioning a mask above said resist layer, said mask covering one or more first portions of said resist layer and not covering one or more second portions of said resist layer;
exposing said second portions of said resist layer to a light source;
removing the mask; and
bringing the resist layer in contact with a developer comprising potassium, wherein said developer removes said resist portions that have been exposed and texturizes the surface of at least the top layer of said stack by wet etching said surface, in the areas situated underneath said resist portions that have been exposed.

According to an example embodiment, the stack of layers comprises a GaN layer and a buffer layer, the buffer layer comprising an AlN layer on top of a AlGaN layer, and the resist layer is deposited directly on said AlN layer, so that at least said AlN layer is texturized.

According to another example embodiment, the stack of layers comprises a GaN layer and the resist is deposited directly on said GaN layer, so that at least said GaN layer is texturized.

In an example embodiment, the wet etching may be done under conditions of photoelectrochemical etching.

According to an example embodiment, the developer is a solution of one or more potassium borates in water.

These as well as other aspects, advantages, and alternatives, will become apparent to those of ordinary skill in the art by reading the following detailed description, with reference where appropriate to the accompanying drawings.

BRIEF DESCRIPTION OF THE FIGURES

The disclosure will be further elucidated by means of the following description and the appended figures. Various exemplary embodiments are described herein with reference to the following figures, wherein like numerals denote like entities. The figures described are schematic and are non-limiting. Further, any reference signs in the claims shall not be construed as limiting the scope of the present disclosure. Still further, in the different figures, the same reference signs refer to the same or analogous elements.

DETAILED DESCRIPTION OF THE DISCLOSURE

The disclosure is related to a process wherein a stack of layers comprising at least a GaN layer is texturized by performing the following steps:
providing a substrate comprising on its surface said stack of layers,
depositing a resist layer directly on said stack,
positioning a mask above said resist layer, said mask covering one or more first portions of said resist layer and not covering one or more second portions of said resist layer,
exposing said second portions of said resist layer to a light source,
removing the mask, and bringing the resist layer in contact with a developer comprising potassium, wherein said developer removes said resist portions that have been exposed and texturizes the surface of at least the top layer of said stack, in the areas situated underneath said resist portions that have been exposed.

The disclosure will be described in more detail on the basis of an example embodiment. All parameter values given hereafter are cited by way of example only and are not limiting the scope of the disclosure. One way of producing GaNLED devices is by a GaN layer transfer process applied after the fabrication of LEDs on Si (111) wafers comprising p and n contact formation to the GaN layer. After applying a passivation layer, a bonding metal is deposited. The wafer is then bonded to a Si carrier substrate (which can be a Si(100) or Si(111) substrate) using metallic bonding at a temperature of about 250° C. Next, the original Si (111) substrate is completely removed by grinding and wet etching. GaNLEDs are thus transferred to a new carrier substrate.

Figure 1:
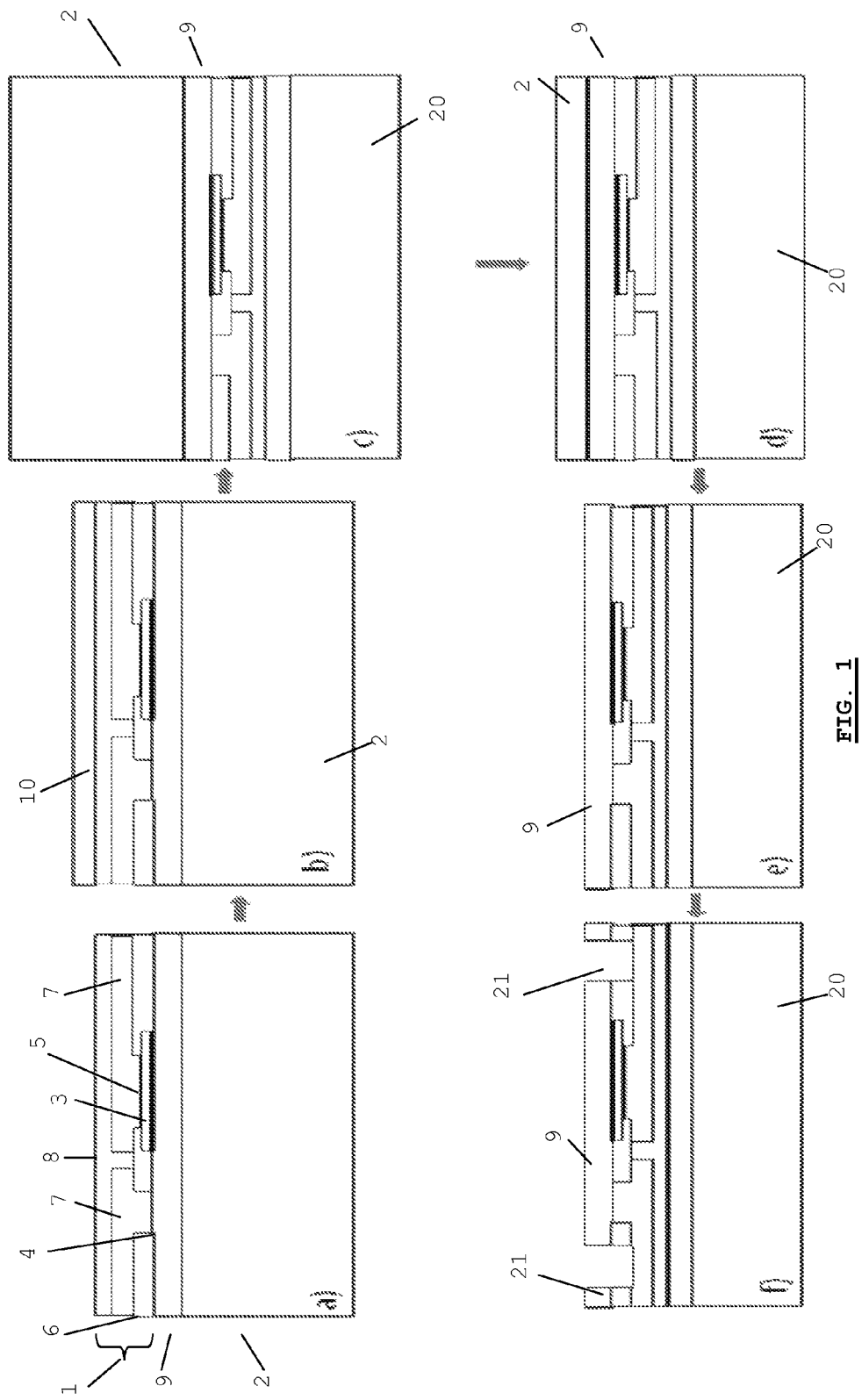
FIG. 1 illustrates a prior art process for transferring a GaNLED device from a first substrate to a second (carrier) substrate.

FIG. 1 gives an overview of the bonding steps according to the example method summarized in the previous paragraph. First, the GaNLED device 1 is produced on a Si(111) substrate 2 (FIG. 1a). This may take place, for example, by the following steps:
1. epitaxial growth of GaN-based LED layers,
2. dopant activation anneal,
3. dry etching of the LED mesa 3,
4. patterning of Ag-based p-type and Ti/Al-based n-type contacts 4/5 using lift-off,
5. deposition of a CVD $SiO_2$ inter-metal dielectric (IMD) 6,
6. patterning of contact holes towards the p- and n-type electrodes using dry etch,
7. deposition and patterning of a Au-based interconnect layer 7 and
8. deposition of a CVD $SiO_2$ passivation layer 8.

The GaN-based LED layers may be deposited using a Aixtron MOCVD epi reactor. The total stack thickness is about 3.7 μm and consists of a buffer layer comprising AlN/AlGaN/GaN layers to reduce defect density, n-type Si-doped and p-type Mg-doped GaN cladding layers, multiple InGaN quantum wells (MQW) and an InGaN electron blocking layer (EBL). The mesa etch removes the pGaN, EBL, MQW and part of the nGaN layer such that the remaining thickness of the GaN stack 9 in field regions is 2.8 to 3 μm.

Figure 2:
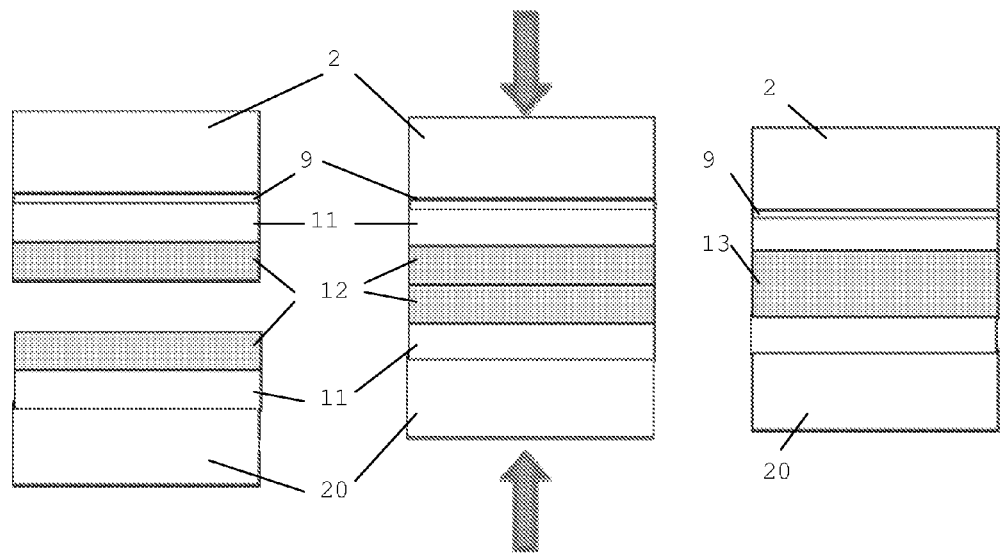
FIG. 2 shows details of the metal bonding steps taking place in the process of FIG. 1.

Then the Cu/Sn bonding layers 10 are produced, see figure 1b and illustrated in more detail in FIG. 2 (in FIG. 2, the device layer 1 is not shown for the sake of simplicity). A seed layer for Cu deposition (e.g 30 nmTiW/150 nm, not shown) may be deposited on top of the oxide passivation of the device wafer. The same type of seed layer may be deposited directly on the Si (100) or Si(111) carrier wafer. After seed layer deposition, a 5 μm Cu layer 11 followed by a 10 μm Sn layer 12 are deposited on the device wafer using electroplating. The same layer of Cu/Sn is then electroplated on the carrier wafer 20. Other compositions of the metal layers may be used, as well as other thicknesses of these layers. For example, one surface may receive a Cu/Sn layer while the other receives only a Cu layer. The advantage of using a Cu/Sn layer on both sides is that it does not require any cleaning treatment of the Sn surface before bonding.

After metallization, the two wafers are bonded (FIG. 1c) in a suitable apparatus, e.g. an EVG 520 bonder, using a sequence as shown in FIG. 2. First, the two wafers are brought into contact. Then, the temperature of the bonding chuck is raised to 250° C. and maintained for 10 min. At the same time, a load of 1000 N is applied to the wafer stack. Again, these parameters are mere examples and not limiting to the disclosure scope. The metallic bonding is made by diffusion soldering (or transient liquid phase soldering) of the Cu—Sn system. The solder layers 12 (Sn) melt and diffuse into the two parent layers (Cu) at moderate temperatures (250° C.), thereby forming a layer 13 of copper-tin intermetallics ($Cu_xSn_y$). The $Cu_xSn_y$ intermetallics have a much higher melting temperature (>415° C.) than the original Sn (232° C.). This provides an advantage such that, during any subsequent (high temperature) processing, the metallic seal remains in a solid state.

Then the Si(111) device wafer is removed in two processing steps: Thinning down the Si device substrate to a thickness of ~100 μm or lower (FIG. 1d) and wet etching of the remaining Si (FIG. 1e). Thinning of the Si wafer from the original thickness of 1000 μm down to 100 μm may be performed by grinding or lapping and polishing. To further remove the Si device substrate, an isotropic Si wet etching process may be applied using an HNA solution (etch solution composed of HF: HNO3: CH3COOH). These steps are then followed by the texturization and opening of the contacts 21 (FIG. 1f). The actual texturization step is not shown in FIG. 1, but will be explained in more detail hereafter.

Figure 3:
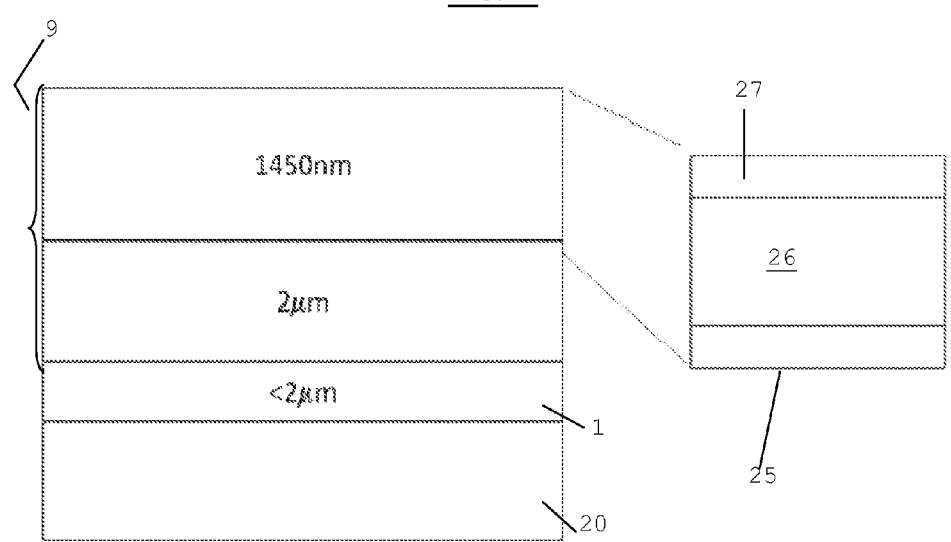
FIG. 3 details the GaN stack texturized with the method of the disclosure according to an example embodiment.

FIG. 3 shows a detail of the composition of the stack 9, as present on the carrier wafer 20, after the removal of the device substrate 2 (i.e. as shown in FIG. 1e). A buffer layer is present on top, consisting of a layer of undoped GaN 25, a layer of AlGaN 26 (this is preferably a stack of multiple AlGaN layers with varying composition), and a top layer of AlN 27. The thicknesses indicated in FIG. 3 are examples of realistic layer thicknesses. Other layer thicknesses are possible as well. The 'device layers' 1 include the LED mesa and contact layers as shown in more detail in FIG. 1. The n-GaN layer 24 is the remainder of the original n-GaN layer remaining after the mesa etch.

Figure 4:
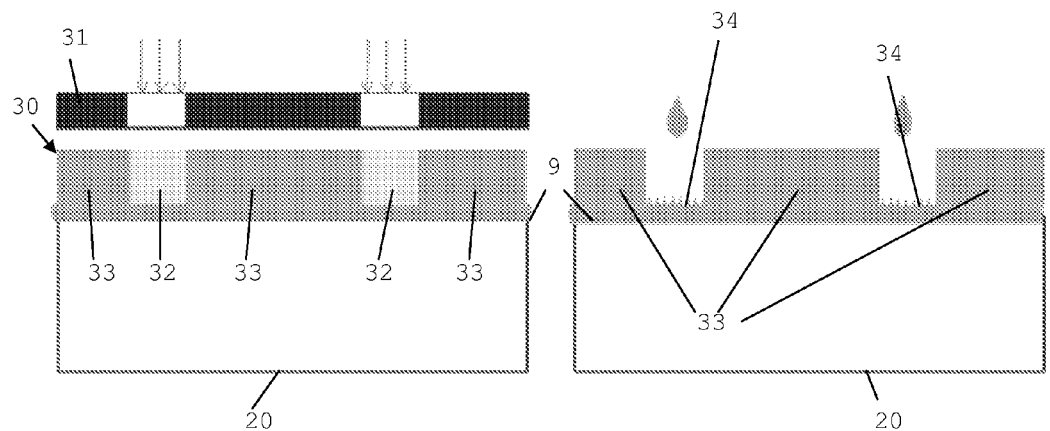
FIG. 4 illustrates the steps of a texturizing method according to an example embodiment of the present disclosure.
Figure 5:
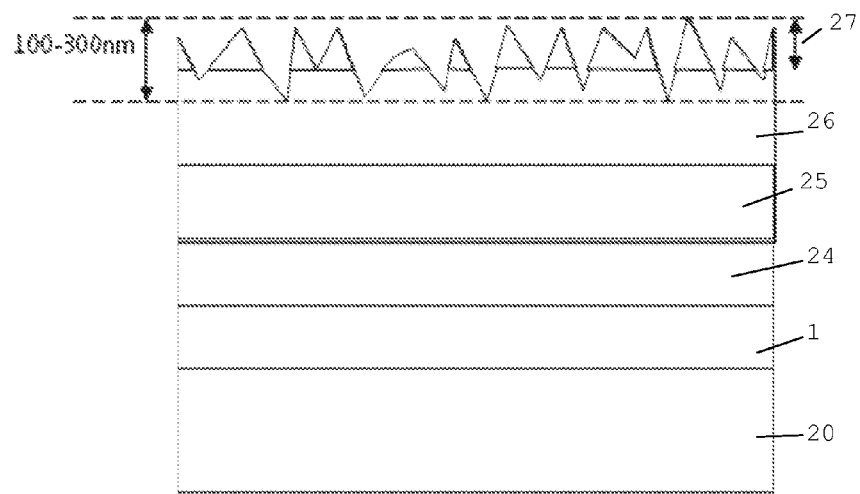
FIG. 5 illustrates the texturization of the GaN based layer of FIG. 3 according to an example embodiment of the method of the present disclosure.

According to an example embodiment of the disclosure, the thus produced GaN stack 9 is subjected to a texturization step before opening the contacts 21, as illustrated in FIG. 4. A resist layer 30 is deposited on the GaN stack 9, and exposed to light through a mask 31. The mask covers areas 33 of the resist layers and leaves areas 32 of the resist uncovered. After being exposed to light, the areas 32 are removed, by contacting them with a liquid developing agent comprising potassium. In an example, the developing agent is a solution of potassium borates (such as potassium tetraborate ($K_2[B_4O_5(OH)_4]$ $\cdot 2H_2O$) in water. In accordance with an example embodiment, a suitable developer may be prepared by mixing the commercial product AZ®400K, available from AZ Electronic Materials, which is a concentrate of potassium borates in water, with a suitable amount of deionized water. For example, by mixing 1 part AZ400K and 4 parts deionized water, a developer is obtained with a concentration of 0.28 N (normality) of potassium borate in water. According to an example of the disclosure, the contact with the potassium-containing developer is maintained until all the resist is removed from the exposed areas 32, and continued until the exposed areas 34 of the GaN stack 9 are texturized through the contact with the developer. It has been found that the buffer layer is etched by the potassium containing developer under normal wet etching conditions (i.e. at room temperature and without (photo) electrochemical etching), resulting in the texturization. FIG. 5 shows the result of an example particular test performed in accordance with the present disclosure. The top AlN layer 27 is texturized as well as a portion of the underlying AlGaN layer 26, resulting in a roughness of about 100-300 nm (peak to peak). To achieve this result, the developer used was prepared on the basis of AZ400K as described above (0.28 N (normality) of potassium borate in water). The resist used is the commercial product AZ10XT obtainable from AZ (but other resist products also work with AZ400K developer or the like). The contact time was 5 min and the temperature was 25° C. Generally in the method of the disclosure, this contact time may be between 5 and 10 minutes. However, in other examples, the contact time may be higher or lower. As the texturizing is done by the resist developer, no resist is removed in the areas 33 during the texturizing step, and the texturization is effectively localized. After resist removal, only the exposed areas 32 (device areas) are texturized, while the areas 33 (e.g an alignment marks region) is protected by the resist and will not be textured The disclosure is furthermore advantageous in terms of time and production cost, because the removal of resist and the texturizing of local areas is done in one step. The method of the disclosure does not require a hard mask process for the selective texturization.

According to another example embodiment, the texturization is done on the GaN stack 9 when it is still present on the device wafer 2. The steps described above involving the deposition on the GaN stack 9 and patterning of a resist layer 30 are applicable to this embodiment also. In this example case however, the top layer that first comes into contact with the developer, when the resist is removed, is the GaN layer 24 and/or the GaN layer on top of the mesa 3 (FIG. 1a). Depending on the defect density in these GaN layers, texturization can be done of the GaN layer under normal wet etching conditions using a potassium-containing developer as described above. According to an example embodiment however, texturization of the GaN layer is done by photoelectrochemical etching (PEC), for example according to the method described in 'Comparison of different GaN etching techniques', Lei Ma et al, CS MANTECH Conference, Apr. 24-27, 2006, Vancouver.

According to yet another example embodiment, the texturization according to the disclosure is done on a GaN stack that is not produced according to the embodiment of FIG. 1, e.g. a stack that is produced in another process, that does not involve the transfer of the GaN stack to a carrier wafer. Other example GaN stack production methods are possible as well.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being deposited or produced 'on' another layer or substrate, includes the options of said layer being produced or deposited directly on, i.e. in contact with, said other layer or substrate, and said layer being produced on one or a stack of intermediate layers between said layer and said other layer or substrate.

Figure 6:
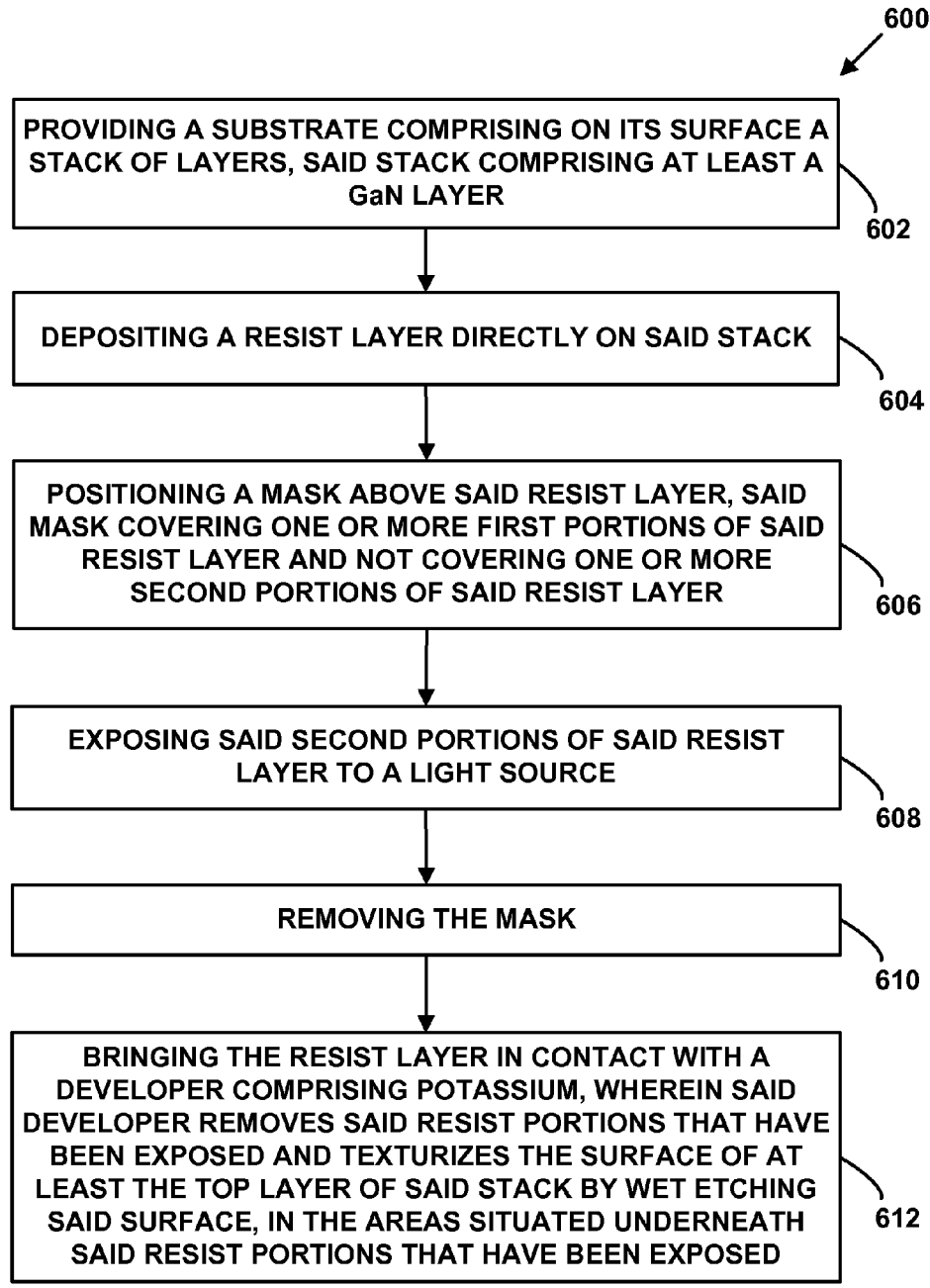
FIG. 6 illustrates an example method, according to an example embodiment of the present disclosure.

FIG. 6 is a flow chart illustrating a method according to an example embodiment. More specifically, example method 600 involves providing a substrate comprising on its surface a stack of layers, said stack comprising at least a GaN layer, as shown by block 602. The method further involves depositing a resist layer directly on said stack, as shown by block 604.

Still further, the method involves positioning a mask above said resist layer, said mask covering one or more first portions of said resist layer and not covering one or more second portions of said resist layer, as shown by block 606. Yet still further, the method involves exposing said second portions of said resist layer to a light source, as shown by block 608.

The method may then involve removing the mask, as shown by block 610, and bringing the resist layer in contact with a developer comprising potassium, wherein said developer removes said resist portions that have been exposed and texturizes the surface of at least the top layer of said stack by wet etching said surface, in the areas situated underneath said resist portions that have been exposed, as shown by block 612.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

The invention claimed is:

1. A method for producing a GaNLED device, the method comprising:

providing a substrate comprising on its surface a stack of layers, said stack comprising at least a GaN layer;

depositing a resist layer directly on said stack;

positioning a mask above said resist layer, said mask covering one or more first portions of said resist layer and not covering one or more second portions of said resist layer;

exposing said second portions of said resist layer to a light source;

removing the mask; and bringing the resist layer in contact with a developer comprising potassium, wherein said developer removes said resist portions that have been exposed and texturizes the surface of at least the top layer of said stack by wet etching said surface, in the areas situated underneath said resist portions that have been exposed.

2. The method according to claim 1, wherein the stack of layers comprises a GaN layer and a buffer layer, said buffer layer comprising an AlN layer on top of a AlGaN layer, and wherein the resist layer is deposited directly on said AlN layer, so that at least said AlN layer is texturized.

3. The method according to claim 1, wherein said stack of layers comprises a GaN layer and wherein said resist is deposited directly on said GaN layer, so that at least said GaN layer is texturized.

4. The method according to claim 1, wherein said wet etching is performed under conditions of photoelectrochemical etching.

5. The method according to claim 1, wherein said developer is a solution of one or more potassium borates in water.

6. The method according to claim 1, wherein the contact with the developer is maintained for between 5 minutes and 10 minutes.

7. The method according to claim 1, wherein said developer is a solution with a concentration of 0.28 N of potassium borate in water, and wherein the contact with the developer is maintained for at least 5 minutes at a temperature of around 25° C.

* * * * *